(12) United States Patent
Cho et al.

(10) Patent No.: US 9,343,625 B2
(45) Date of Patent: May 17, 2016

(54) SEMICONDUCTOR LIGHT EMITTING DIODE AND METHOD FOR MANUFACTURING THE SAME

(75) Inventors: Byoung gu Cho, Seoul (KR); Se-Hun Kwon, Seoul (KR); Jae-Sik Min, Seoul (KR)

(73) Assignee: Chip Technology Inc., Seoul (KR)

( * ) Notice: Subject to any disclaimer, the term of this patent is extended or adjusted under 35 U.S.C. 154(b) by 813 days.

(21) Appl. No.: 13/340,584

(22) Filed: Dec. 29, 2011

(65) Prior Publication Data

US 2013/0168636 A1 Jul. 4, 2013

(51) Int. Cl.
*H01L 33/24* (2010.01)
*H01L 33/00* (2010.01)

(52) U.S. Cl.
CPC .............. *H01L 33/24* (2013.01); *H01L 33/007* (2013.01)

(58) Field of Classification Search
CPC ....................................................... H01L 33/24
See application file for complete search history.

(56) References Cited

U.S. PATENT DOCUMENTS

2010/0065881 A1* 3/2010 Kim ............................... 257/99

FOREIGN PATENT DOCUMENTS

KR 1020100006547 A 1/2010

* cited by examiner

*Primary Examiner* — Raj R Gupta
(74) *Attorney, Agent, or Firm* — Madeline F. Schiesser; Keohane & D'Alessandro, PLLC

(57) ABSTRACT

A semiconductor light emitting diode is provided. The semiconductor light emitting diode comprises a metal electrode; an n-type cladding over the metal electrode, the n-type cladding comprising a pillar support part formed of an n-type semiconductor material, and a pillar part having a plurality of pillars formed of an n-type semiconductor material over the pillar support part; an active part conformally formed over the pillar part so as to enclose the pillar part and over the pillar support part between the pillar parts, the active part having a quantum well layer and a barrier layer stacked alternately; a p-type cladding conformally formed of a p-type semiconductor material over the active part; and a transparent electrode formed over the p-type cladding.

16 Claims, 7 Drawing Sheets

SEMICONDUCTOR LIGHT EMITTING DIODE AND METHOD FOR MANUFACTURING THE SAME

CROSS-REFERENCE TO RELATED APPLICATIONS

The present application claims priority under 35 U.S.C. 119 and 35 U.S.C. 365 to Korean Patent Application No. 10-2011-0073678 filed on Jul. 25, 2011, which is hereby incorporated by reference in its entirety.

FIELD OF THE DISCLOSURE

The present disclosure relates to a semiconductor light emitting diode emitting visible or ultraviolet wavelength light, and a method for manufacturing the same, and more particularly, to a semiconductor light emitting diode that can effectively increase the effective light emitting area by forming a cladding including a pillar part and a pillar support part and conformally forming an active layer over the pillar part and the pillar support part, and a method for manufacturing the same.

BACKGROUND

Recently, a semiconductor light emitting diode (LED) in which aluminum (Al) or indium (In) is added in GaN is in the spotlight as a next generation light emitting device that can save energy consumption, and expands its applications to the fields of visible rays and ultraviolet rays.

To improve the light emitting efficiency of the above-mentioned semiconductor light emitting diode, Korean Patent Publication No. 10-2010-0006547 discloses a method for forming an active layer emitting light in a multi quantum well structure.

The semiconductor light emitting diode disclosed in the above cited document, however, has a difficulty in securing a sufficient effective light emitting area to decrease a loss of the light emitting area.

SUMMARY

Embodiments provide a semiconductor light emitting diode that can effectively increase the effective light emitting area by forming a cladding including a pillar part and a pillar support part, and conformally forming an active layer on the pillar part and the pillar support part.

Embodiments also provide a method for manufacturing a semiconductor light emitting diode that can easily manufacture the foregoing semiconductor light emitting diode.

The technical objects of the present disclosure are not limited to the aforesaid, and other technical objects not described herein will be clearly understood by those skilled in the art from descriptions below.

In one embodiment, a semiconductor light emitting diode includes: a metal electrode; an n-type cladding over the metal electrode, the n-type cladding including a pillar support part formed of an n-type semiconductor material, and a pillar part having a plurality of pillars formed of an n-type semiconductor material over the pillar support part; an active part conformally formed over the pillar part so as to enclose the pillar part and over the pillar support part between the pillar parts, the active part having a quantum well layer and a barrier layer stacked alternately; a p-type cladding conformally formed of a p-type semiconductor material over the active part; and a transparent electrode formed over the p-type cladding.

In another embodiment, a semiconductor light emitting diode includes: a transparent electrode; an n-type cladding over the transparent electrode, the n-type cladding including a pillar support part formed of an n-type semiconductor material, and a pillar part having a plurality of pillars formed of an n-type semiconductor material over the pillar support part; an active part conformally formed over the pillar part so as to enclose the pillar part and over the pillar support part between the pillar parts, the active part having a quantum well layer and a barrier layer stacked alternately; a p-type cladding conformally formed of a p-type semiconductor material over the active part; and a metal electrode formed over the p-type cladding.

In further another embodiment, a semiconductor light emitting diode includes: a metal electrode; a p-type cladding over the metal electrode, the p-type cladding including a pillar support part formed of a p-type semiconductor material, and a pillar part having a plurality of pillars formed of a p-type semiconductor material over the pillar support part; an active part conformally formed over the pillar part so as to enclose the pillar part and over the pillar support part between the pillar parts, the active part having a quantum well layer and a barrier layer stacked alternately; an n-type cladding conformally formed of an n-type semiconductor material over the active part; and a transparent electrode formed over the n-type cladding.

In still further another embodiment, a semiconductor light emitting diode includes: a transparent electrode; a p-type cladding over the transparent electrode, the p-type cladding including a pillar support part formed of a p-type semiconductor material, and a pillar part having a plurality of pillars formed of a p-type semiconductor material over the pillar support part; an active part conformally formed over the pillar part so as to enclose the pillar part and over the pillar support part between the pillar parts, the active part having a quantum well layer and a barrier layer stacked alternately; an n-type cladding conformally formed of an n-type semiconductor material over the active part; and a metal electrode formed over the n-type cladding.

In yet further another embodiment, a method for manufacturing a semiconductor light emitting diode includes: forming an n-type cladding over a semiconductor substrate, the n-type cladding including a pillar support part formed of an n-type semiconductor material, and a pillar part having a plurality of pillars formed of an n-type semiconductor material over the pillar support part; forming an active part by alternately and conformally stacking a quantum well layer and a barrier layer over the pillar part and over the pillar support part between the pillar parts; conformally forming a p-type cladding of a p-type semiconductor material over the active part; forming a transparent electrode over the p-type cladding; and forming a metal electrode over a bottom surface of the pillar support part where the pillar part is not formed.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Figure 1:
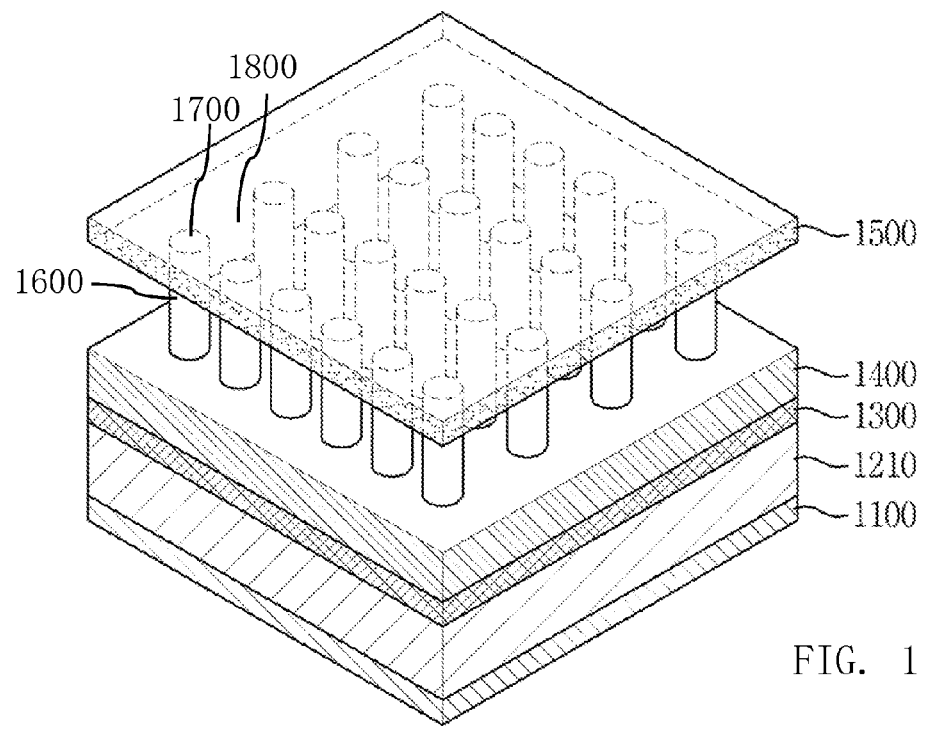
FIG. 1 is a perspective view of a semiconductor light emitting diode according to a first embodiment.
Figure 2:
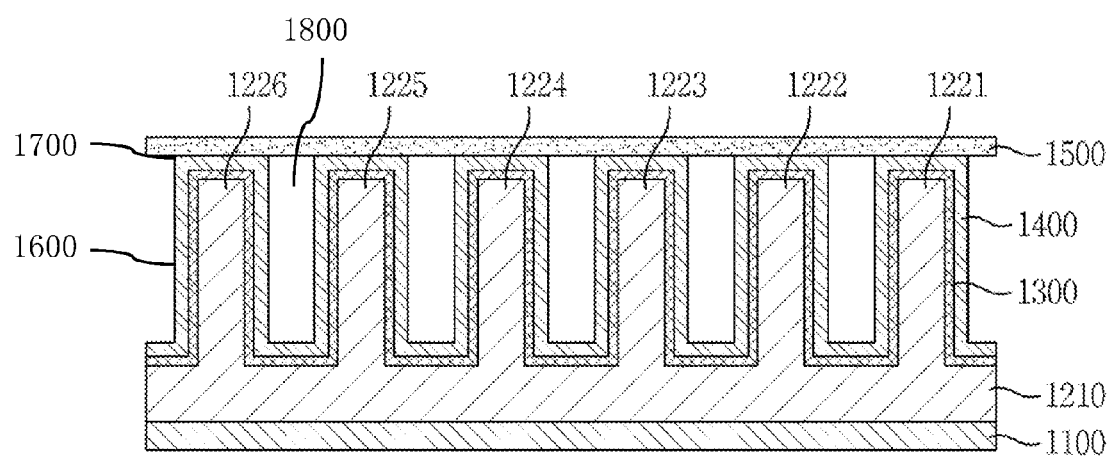
FIG. 2 is a cross-sectional view of a semiconductor light emitting diode according to a first embodiment.

In an embodiment, a semiconductor light emitting diode may include a metal electrode 1100, an n-type cladding 1210, 1221, 1222, 1223, 1224, 1225, and 1226, an active part 1300, a p-type cladding 1400, and a transparent electrode 1500, as illustrated in FIGS. 1 and 2.

The n-type cladding 1210, 1221, 1222, 1223, 1224, 1225, and 1226 includes a pillar supporting part 1210 formed of an n-type semiconductor material over the metal electrode 1100, and a pillar part 1221, 1222, 1223, 1224, 1225, and 1226 having a plurality of pillars and formed of an n-type semiconductor material over the pillar supporting part 1210. The n-type cladding 1210, 1221, 1222, 1223, 1224, 1225, and 1226 may be formed of an n-type GaN.

Meanwhile, the active part 1300 is conformally formed over the n-type cladding 1210, 1221, 1222, 1223, 1224, 1225, and 1226 so as to enclose the pillar parts 1221, 1222, 1223, 1224, 1225, and 1226 and the pillar supporting part between the pillar parts 1221, 1222, 1223, 1224, 1225, and 1226, and includes a quantum well layer and a barrier layer stacked alternately.

Furthermore, the active part 1300 may include an AlGaN quantum well layer and an AlGaN barrier layer stacked alternately, or a plurality of AlGaN quantum well layers and a plurality of AlGaN barrier layers stacked alternately, if necessary.

Also, the p-type cladding 1400 is conformally formed of a p-type semiconductor material, e.g., a p-type GaN, over the active layer 1300.

Further referring to FIG. 2, in some embodiments, pillar parts 1221-1226 that have a plurality of pillars and are formed of an n-type semiconductor material conformally over the pillar supporting part 1210, the active part or layer 1300 that is conformally formed over the plurality of pillars of pillar parts 1221-1226 and over the pillar supporting part 1210 between the plurality of pillars, and the p-type cladding 1400 that is conformally formed over the active layer 1300, constitute a plurality of the columns 1600. The plurality of the columns 1600 may be configured to maintain a space 1800 between each column of the plurality of columns 1600. The transparent electrode 1500 may be situated over a top of the plurality of columns 1600. For example, the transparent electrode 1500 may physically touch only an uppermost surface or face of each column 1700 of the plurality of columns 1600.

The transparent electrode 1500 is formed of a transparent material, such as indium tin oxide (ITO), fluorine-doped tin oxide (FTC)), or the like over the p-type cladding 1400.

Hereinafter, a method for manufacturing a semiconductor light emitting diode according to a first embodiment will be described with reference to FIGS. 3A to 3F.

Figure 3A:
FIGS. 3A to 3F are cross-sectional views illustrating a method for manufacturing a semiconductor light emitting diode according to a first embodiment.
Figure 3B:
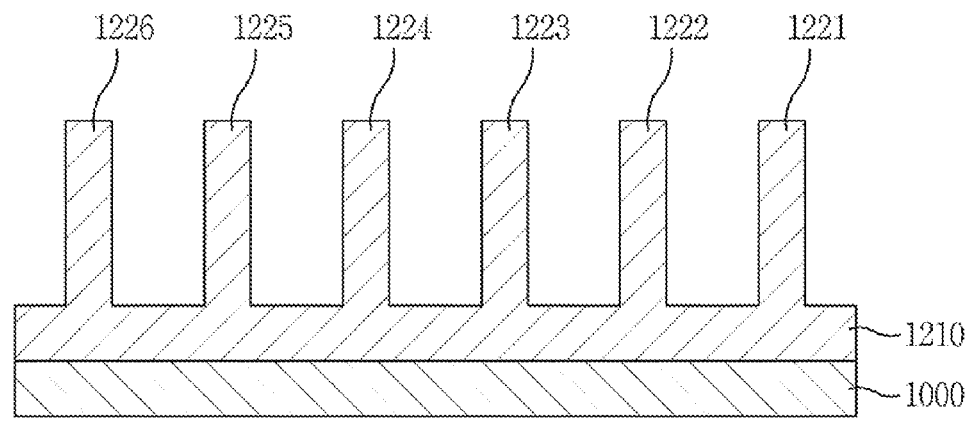
Figure 3C:
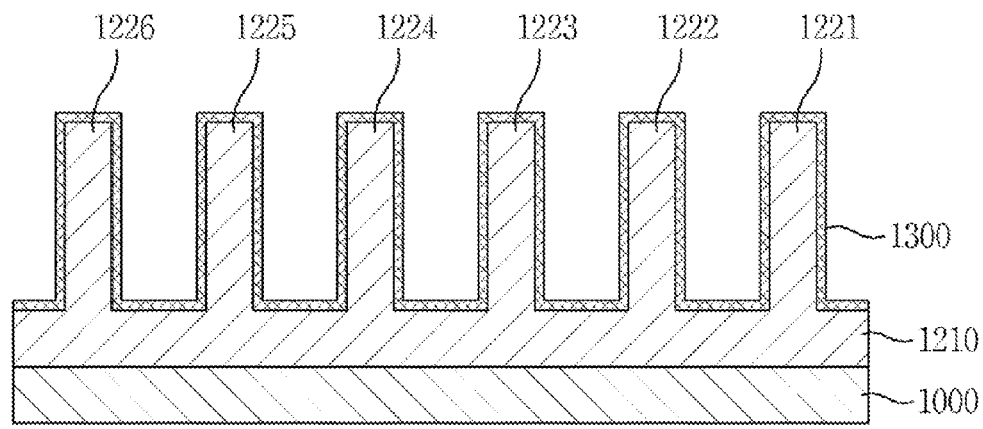
Figure 3D:
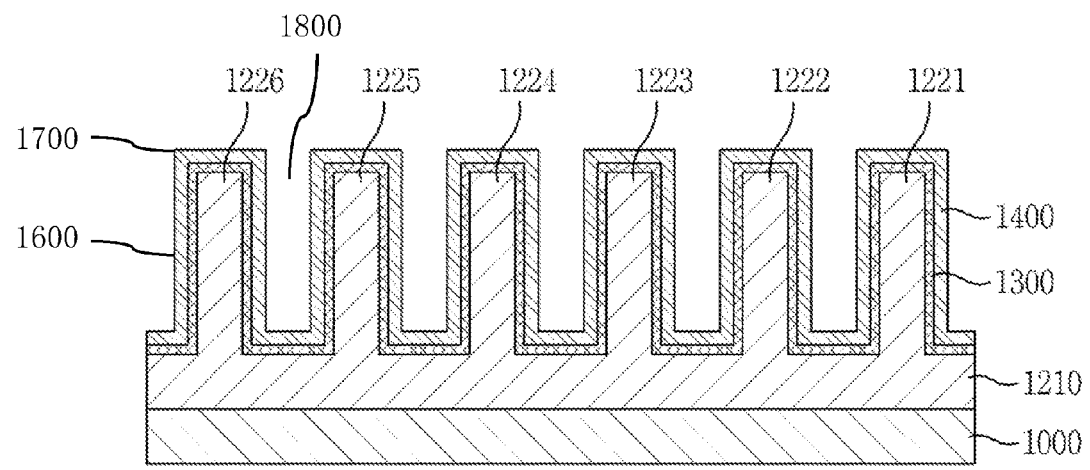
Figure 3E:
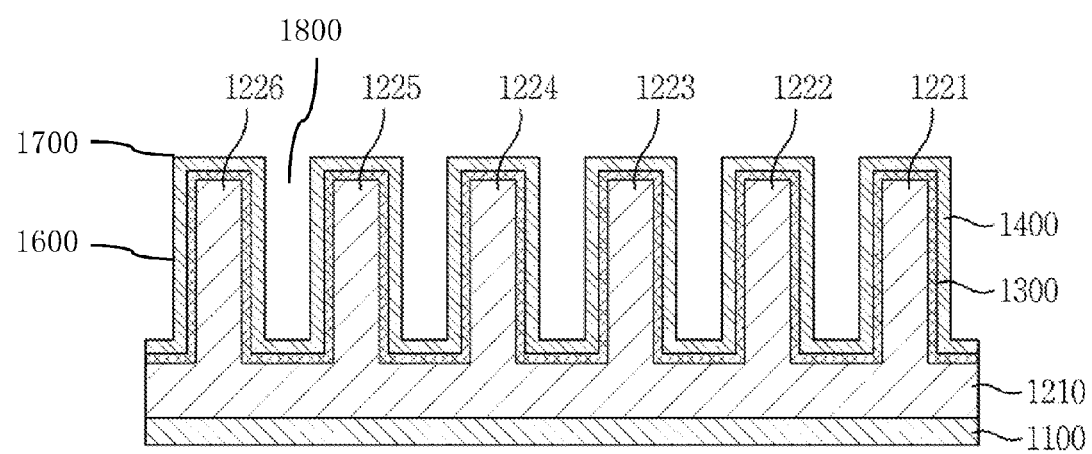
Figure 3F:
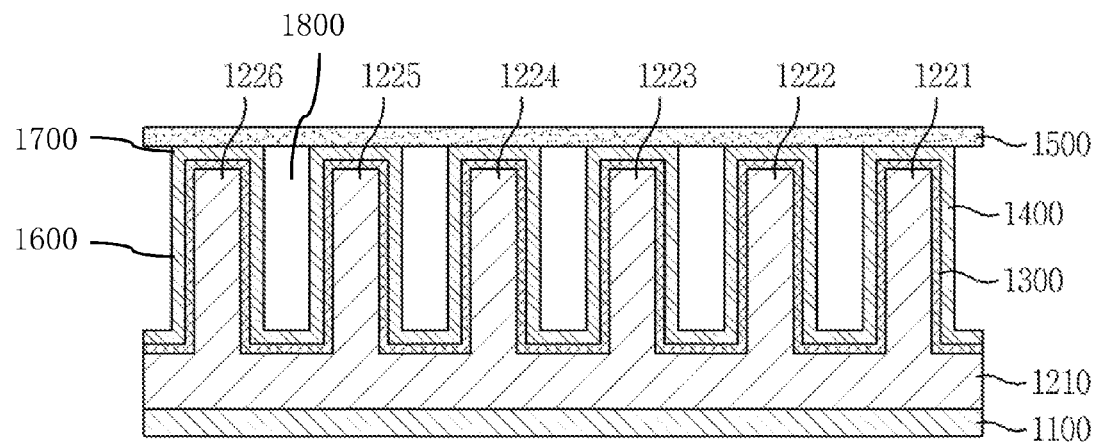

First, as illustrated in FIG. 3A, a pillar supporting part 1210 for an n-type cladding 1210, 1221, 1222, 1223, 1224, 1225, and 1226 is formed of an n-type semiconductor material over a semiconductor substrate 1000, such as a sapphire substrate, by using an atomic layer deposition (ALD). The pillar supporting part 1210 for the n-type cladding 1210, 1221, 1222, 1223, 1224, 1225, and 1226 may be formed of an n-type GaN.

Subsequently, a pillar part 1221, 1222, 1223, 1224, 1225, and 1226 having a plurality of pillars for the n-type cladding 1210, 1221, 1222, 1223, 1224, 1225, and 1226 is formed of an n-type semiconductor material over the pillar supporting part 1210. The pillar part 1221, 1222, 1223, 1224, 1225, and 1226 for the n-type cladding 1210, 1221, 1222, 1223, 1224, 1225, and 1226 may be formed of an n-type GaN.

Alternatively, the pillar part 1221, 1222, 1223, 1224, 1225, and 1226 may be formed by forming a bulk layer over the semiconductor substrate 1000 by using an atomic layer deposition (ALD) or the like and then patterning the bulk layer by using an etch process.

As another alternative, the pillar part 1221, 1222, 1223, 1224, 1225, and 1226 for the n-type cladding 1210, 1221, 1222, 1223, 1224, 1225, and 1226 may be formed by forming a photo resist pattern partially exposing the pillar supporting part 1210 of n-type semiconductor material and then selectively depositing an n-type semiconductor material over the exposed pillar supporting part 1210 of n-type semiconductor material Subsequently, the active part 1300 is conformally formed over the n-type cladding 1210, 1221, 1222, 1223, 1224, 1225, and 1226 so as to enclose the pillar parts 1221, 1222, 1223, 1224, 1225, and 1226 and the pillar supporting part between the pillar parts 1221, 1222, 1223, 1224, 1225, and 1226, and includes a quantum well layer and a barrier layer stacked alternately.

In detail, an AlGaN quantum well layer and an AlGaN barrier layer are conformally stacked over the pillar part 1221, 1222, 1223, 1224, 1225, and 1226 and over the pillar supporting part 1210 between the plurality of pillars 1221, 1222, 1223, 1224, 1225, and 1226 by using an ALD or the like.

The active part 1300 may include a plurality of AlGaN quantum well layers and a plurality of AlGaN barrier layers stacked alternately, if necessary.

Next, a p-type cladding layer 1400 is conformally formed of a p-type semiconductor material over the active part 1300 by using an ALD or the like. The p-type cladding 1400 may be formed of a p-type GaN.

Subsequently, the semiconductor substrate 1000 is removed, and then a metal electrode 1100 is formed of a reflective conductive material, such as titanium, silver, copper alloy, or the like over a bottom surface of the pillar supporting part 1210 where the pillar part 1221, 1222, 1223, 1224, 1225, and 1226 is not formed, by using a sputtering, electroplating, or the like.

Next, a transparent electrode 1500 is formed of a transparent conductive material, such as ITO, FTO, or the like over the p-type cladding 1400 by using a sputtering.

While the present embodiment shows and describes that the metal electrode 110 is first formed before the transparent electrode 1500, the forming sequence of the metal electrode 1100 and the transparent electrode 1500 may be reversed. For example, the transparent electrode 1500 is first formed and then the metal electrode 1100 may be formed.

Figure 4:
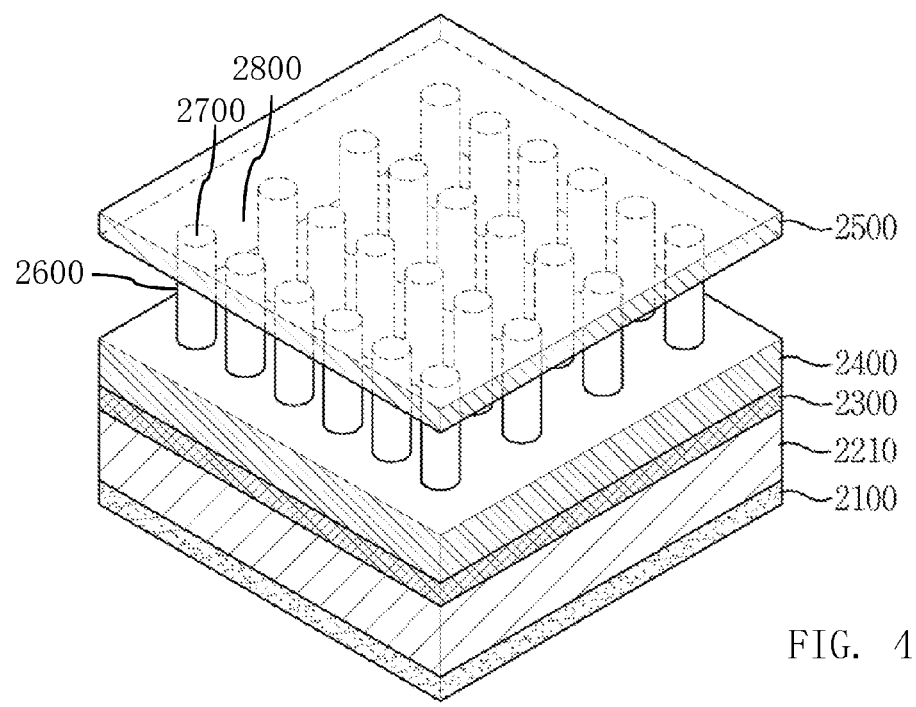
FIG. 4 is a perspective view of a semiconductor light emitting diode according to a second embodiment.
Figure 5:
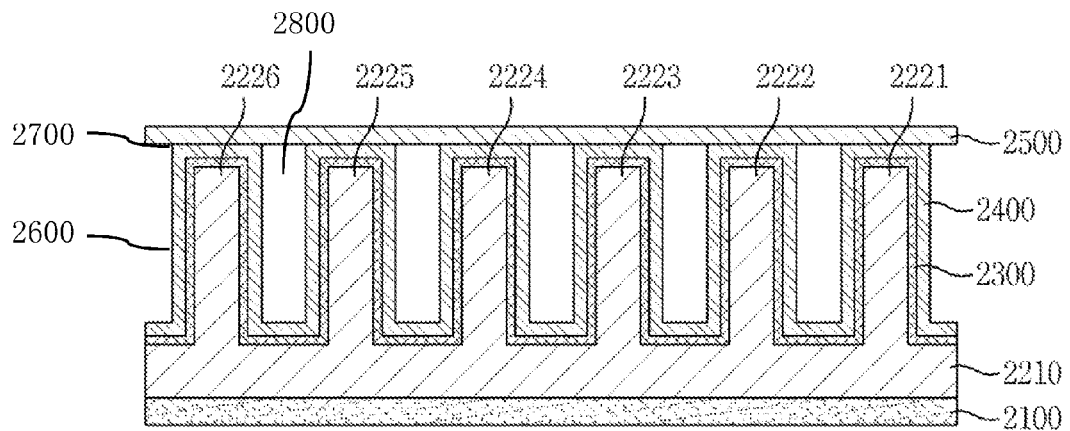
FIG. 5 is a cross-sectional view of a semiconductor light emitting diode according to a second embodiment.

A semiconductor light emitting diode according to a second embodiment will now be described with reference to FIGS. 4 and 5. For convenience of description, only differences from the semiconductor light emitting diode according to the first embodiment will be described.

In a semiconductor light emitting diode according to a second embodiment, an n-type cladding 2210, 2221, 2222, 2223, 2224, 2225, and 2226 including a pillar supporting part 2210 formed of an n-type semiconductor material over a transparent electrode 2100, and a pillar part 2221, 2222, 2223, 2224, 2225, and 2226 having a plurality of pillars formed of an n-type semiconductor material over the pillar supporting part 2210 is formed, and a metal electrode 2500 is formed over a p-type cladding 2400. In some embodiments, pillar parts 2221-2226 that have a plurality of pillars and are formed of an n-type semiconductor material conformally over the pillar supporting part 2210, an active part or layer 2300 that is conformally formed over the plurality of pillars of pillar parts 2221-2226 and over the pillar supporting part 2210 between the plurality of pillars, and a p-type cladding 2400 that is conformally formed over an active layer 2300, constitute a plurality of the columns 2600. The plurality of the columns 2600 may be configured to maintain a space 2800 between each column of the plurality of columns 2600. The metal electrode 2500 may be situated over a top of the plurality of columns 2600. For example, the metal electrode 2500 may physically touch only an uppermost surface or face of each column 2700 of the plurality of columns 2600.

Figure 6:
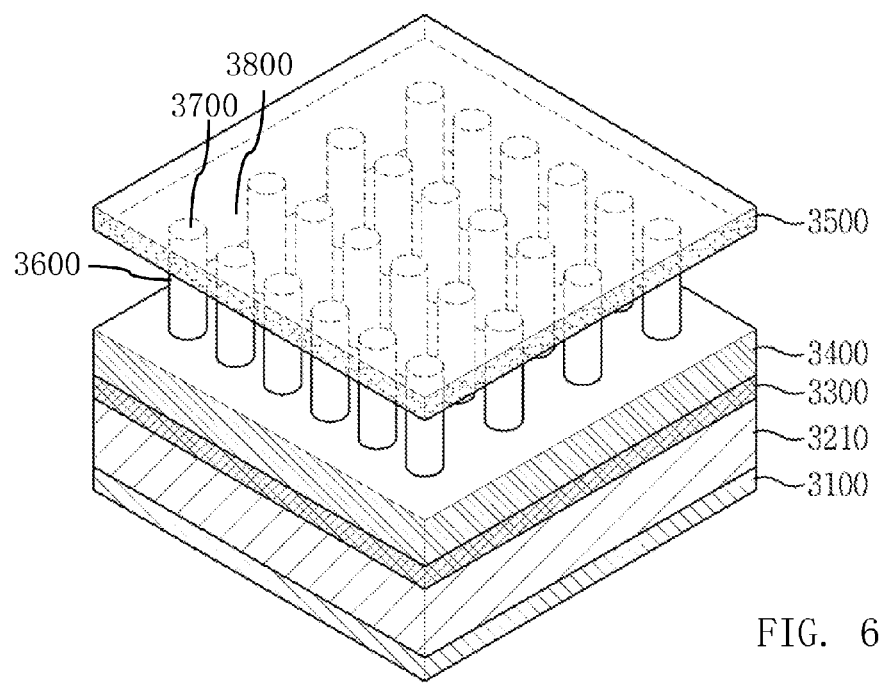
FIG. 6 is a perspective view of a semiconductor light emitting diode according to a third embodiment.
Figure 7:
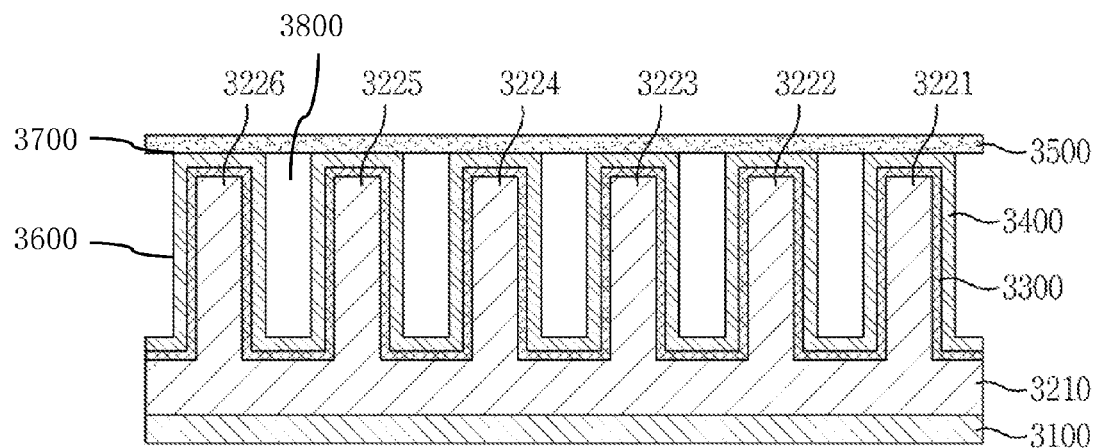
FIG. 7 is a cross-sectional view of a semiconductor light emitting diode according to a third embodiment.

A semiconductor light emitting diode according to a third embodiment will now be described with reference to FIGS. 6 and 7. For convenience of description, only differences from the semiconductor light emitting diode according to the first embodiment will be described.

In a semiconductor light emitting diode according to a third embodiment, a p-type cladding 3210, 3221, 3222, 3223, 3224, 3225, and 3226 including a pillar supporting part 3210 formed of a p-type semiconductor material over a metal electrode 3100, and a pillar part 3221, 3222, 3223, 3224, 3225, and 3226 having a plurality of pillars formed of a p-type semiconductor material over the pillar supporting part 3226 is formed, an n-type cladding 3400 is conformally formed of an n-type semiconductor material over an active part 3300, and a transparent electrode 3500 is formed over the n-type cladding 3400. In some embodiments, pillar parts 3221-3226 that have a plurality of pillars and are formed of a p-type semiconductor material conformally over the pillar supporting part 3210, an active part or layer 3300 that is conformally formed over the plurality of pillars of pillar parts 3221-3226 and over the pillar supporting part 3210 between the plurality of pillars, and the n-type cladding 3400 that is conformally formed over the active layer 3300, constitute a plurality of the columns 3600. The plurality of the columns 3600 may be configured to maintain a space 3800 between each column of the plurality of columns 3600. The transparent electrode 3500 may be situated over a top of the plurality of columns 3600. For example, the transparent electrode 3500 may physically touch only an uppermost surface or face of each column 3700 of the plurality of columns 3600.

Figure 8:
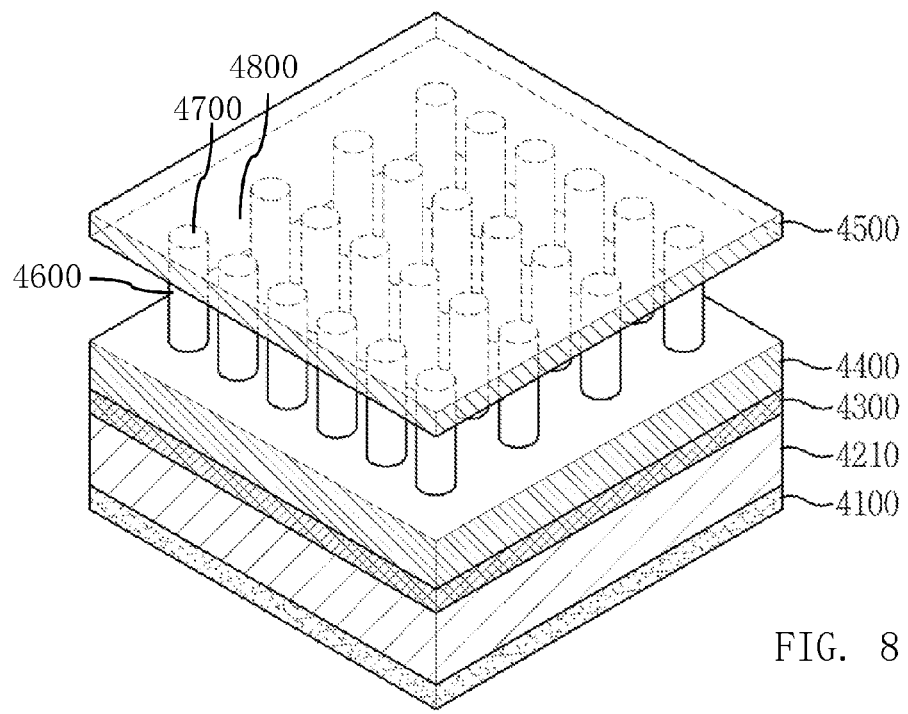
FIG. 8 is a perspective view of a semiconductor light emitting diode according to a fourth embodiment.
Figure 9:
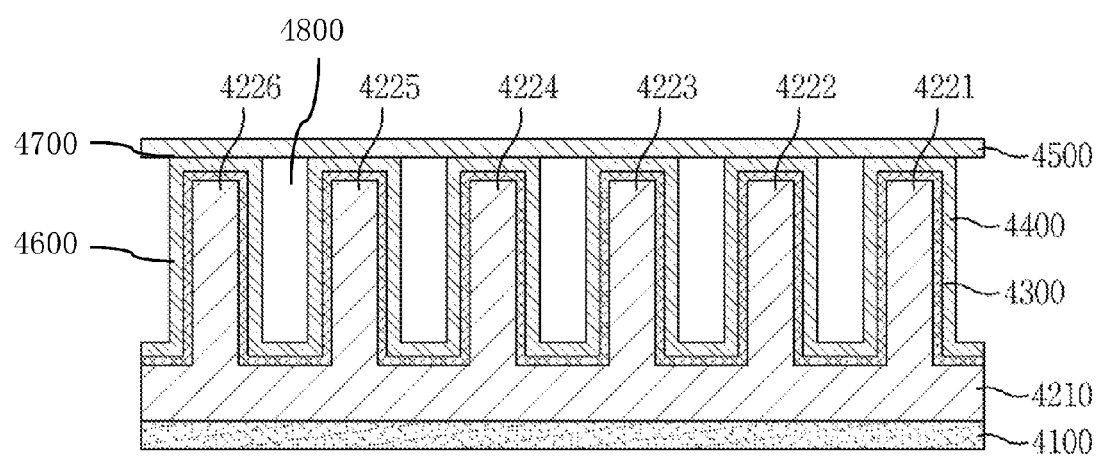
FIG. 9 is a cross-sectional view of a semiconductor light emitting diode according to a fourth embodiment.

A semiconductor light emitting diode according to a fourth embodiment will now be described with reference to FIGS. 8 and 9. For convenience of description, only differences from the semiconductor light emitting diode according to the first embodiment will be described.

In a semiconductor light emitting diode according to a fourth embodiment of the present disclosure, a p-type cladding 4210, 4221, 4222, 4223, 4224, 4225, and 4226 including a pillar supporting part 4210 formed of a p-type semiconductor material over a transparent electrode 4100, and a pillar part 4221, 4222, 4223, 4224, 4225, and 4226 having a plurality of pillars formed of a p-type semiconductor material over the pillar supporting part 4210 is formed, and a metal electrode 4500 is formed over an n-type cladding 4400. In some embodiments, pillar parts 4221-4226 that have a plurality of pillars and are formed of a p-type semiconductor material conformally over the pillar supporting part 4210, an active part or layer 4300 that is conformally formed over the plurality of pillars of pillar parts 4221-4226 and over the pillar supporting part 4210 between the plurality of pillars, and an n-type cladding 4400 that is conformally formed over an active layer 4300, constitute a plurality of the columns 4600. The plurality of the columns 4600 may be configured to maintain a space 4800 between each column of the plurality of columns 4600. The metal electrode 4500 may be situated over a top of the plurality of columns 4600. For example, the metal electrode 4500 may physically touch only an uppermost surface or face of each column 4700 of the plurality of columns 4600.

According to the embodiments, the semiconductor light emitting diode can effectively increase the effective light emitting area by forming a cladding, including a pillar portion and a pillar support portion, and conformally forming an active layer on the pillar portion and the pillar support portion.

Also, according to the embodiments, the method for manufacturing the semiconductor light emitting diode can easily manufacture the foregoing semiconductor light emitting diode.

A semiconductor light emitting diode and a method for manufacturing the same according to embodiments have been described in detail with reference to the accompanying drawings. The invention may, however, be embodied in many different forms and should not be construed as being limited to the embodiments set forth herein; rather, that alternate embodiments included in other retrogressive inventions or falling within the spirit and scope of the present disclosure can easily be derived through adding, altering, and changing, and will fully convey the concept of the invention to those skilled in the art.

What is claimed is:

1. A semiconductor light emitting diode comprising:
    a pair of electrodes comprising a metal electrode and a transparent electrode, wherein the transparent electrode is disposed at a distance over the metal electrode;
    an n-type cladding over the metal electrode, the n-type cladding comprising a pillar support part formed of an n-type semiconductor material, and a plurality of pillars formed of an n-type semiconductor material over the pillar support part, wherein a height of the plurality of pillars exceeds a width of each pillar of the plurality of pillars, and wherein the pillar support part is disposed between the metal electrode and the plurality of pillars;
    an active part conformally formed over the plurality of pillars so as to enclose the plurality of pillars and over the pillar support part between the plurality of pillars, the active part having a quantum well layer and a barrier layer stacked alternately; and
    a p-type cladding conformally formed over the active part, the p-type cladding formed of a p-type semiconductor material,
    wherein the plurality of pillars formed of the n-type semiconductor material, the active layer formed over the plurality of pillars and over the pillar support part, and the p-type cladding formed over the active part constitute a plurality of columns, wherein the plurality of columns are configured to maintain a space between each column of the plurality, and wherein the transparent electrode is disposed over the plurality of columns, the transparent electrode physically touching only an uppermost surface of each column of the plurality of columns.

2. The semiconductor light emitting diode of claim 1, wherein the n-type cladding is formed of an n-type GaN, and the p-type cladding is formed of a p-type GaN.

3. The semiconductor light emitting diode of claim 1, wherein the active part comprises an AlGaN quantum well layer and an AlGaN barrier layer stacked alternately.

4. The semiconductor light emitting diode of claim 3, wherein the active part comprises a plurality of AlGaN quantum well layers and a plurality of AlGaN barrier layers stacked alternately.

5. A semiconductor light emitting diode comprising:
a pair of electrodes comprising a transparent electrode and a metal electrode, wherein the metal electrode is disposed at a distance over the transparent electrode;
an n-type cladding over the transparent electrode, the n-type cladding comprising a pillar support part formed of an n-type semiconductor material, and a plurality of pillars formed of an n-type semiconductor material over the pillar support part, wherein a height of the plurality of pillars exceeds a width of each pillar of the plurality of pillars, and wherein the pillar support part is disposed between the transparent electrode and the plurality of pillars;
an active part conformally formed over the plurality of pillars so as to enclose the pillar part and over the pillar support part between the plurality of pillars, the active part having a quantum well layer and a barrier layer stacked alternately; and
a p-type cladding conformally formed over the active part, the p-type cladding formed of a p-type semiconductor material,
wherein the plurality of pillars formed of the n-type semiconductor material, the active layer formed over the plurality of pillars and over the pillar support part, and the p-type cladding formed over the active part constitute a plurality of columns, wherein the plurality of columns are configured to maintain a space between each column of the plurality, and wherein the metal electrode is disposed over the plurality of columns, the metal electrode physically touching only an uppermost surface of each column of the plurality of columns.

6. The semiconductor light emitting diode of claim 5, wherein the n-type cladding is formed of an n-type GaN, and the p-type cladding is formed of a p-type GaN.

7. The semiconductor light emitting diode of claim 5, wherein the active part comprises an AlGaN quantum well layer and an AlGaN barrier layer stacked alternately.

8. The semiconductor light emitting diode of claim 7, wherein the active part comprises a plurality of AlGaN quantum well layers and a plurality of AlGaN barrier layers stacked alternately.

9. A semiconductor light emitting diode comprising:
a pair of electrodes comprising a metal electrode and a transparent electrode, wherein the transparent electrode is disposed at a distance over the metal electrode;
a p-type cladding over the metal electrode, the p-type cladding comprising a pillar support part formed of a p-type semiconductor material, and a plurality of pillars formed of a p-type semiconductor material over the pillar support part, wherein a height of the plurality of pillars exceeds a width of each pillar of the plurality of pillars, and wherein the pillar support part is disposed between the metal electrode and the plurality of pillars;
an active part conformally formed over the plurality of pillars so as to enclose the plurality of pillars and over the pillar support part between the plurality of pillars, the active part having a quantum well layer and a barrier layer stacked alternately; and
an n-type cladding conformally formed over the active part, the n-type cladding formed of an n-type semiconductor material,
wherein the plurality of pillars formed of the p-type semiconductor material, the active layer formed over the plurality of pillars and over the pillar support part, and the n-type cladding formed over the active part constitute a plurality of columns, wherein the plurality of columns are configured to maintain a space between each column of the plurality, and wherein the transparent electrode is disposed over the plurality of columns, the transparent electrode physically touching only an uppermost surface of each column of the plurality of columns.

10. The semiconductor light emitting diode of claim 9, wherein the n-type cladding is formed of an n-type GaN, and the p-type cladding is formed of a p-type GaN.

11. The semiconductor light emitting diode of claim 9, wherein the active part comprises an AlGaN quantum well layer and an AlGaN barrier layer stacked alternately.

12. The semiconductor light emitting diode of claim 11, wherein the active part comprises a plurality of AlGaN quantum well layers and a plurality of AlGaN barrier layers stacked alternately.

13. A semiconductor light emitting diode comprising:
a pair of electrodes comprising a metal electrode and a transparent electrode, wherein the metal electrode is disposed at a distance over the transparent electrode;
a p-type cladding over the transparent electrode, the p-type cladding comprising a pillar support part formed of a p-type semiconductor material, and a plurality of pillars formed of a p-type semiconductor material over the pillar support part, wherein a height of the plurality of pillars exceeds a width of each pillar of the plurality of pillars, and wherein the pillar support part is disposed between the transparent electrode and the plurality of pillars;
an active part conformally formed over the plurality of pillars so as to enclose the plurality of pillars and over the pillar support part between the plurality of pillars, the active part having a quantum well layer and a barrier layer stacked alternately; and
an n-type cladding conformally formed over the active part, the n-type cladding formed of an n-type semiconductor material,
wherein the plurality of pillars formed of the p-type semiconductor material, the active layer formed over the plurality of pillars and over the pillar support part, and the n-type cladding formed over the active part constitute a plurality of columns, wherein the plurality of columns are configured to maintain a space between each column of the plurality, and wherein the metal electrode is disposed over the plurality of columns, the metal electrode physically touching only an uppermost surface of each column of the plurality of columns.

14. The semiconductor light emitting diode of claim 13, wherein the n-type cladding is formed of an n-type GaN, and the p-type cladding is formed of a p-type GaN.

15. The semiconductor light emitting diode of claim 13, wherein the active part comprises an AlGaN quantum well layer and an AlGaN barrier layer stacked alternately.

16. The semiconductor light emitting diode of claim 15, wherein the active part comprises a plurality of AlGaN quantum well layers and a plurality of AlGaN barrier layers stacked alternately.

* * * * *